(12) United States Patent
Lee (10) Patent No.: US 10,917,084 B2
(45) Date of Patent: Feb. 9, 2021

(54) OUTPUT DRIVING SYSTEM WITH CAPACITANCE COMPENSATION

(71) Applicant: Shanghai Zhaoxin Semiconductor Co., Ltd., Shanghai (CN)

(72) Inventor: Yeong-Sheng Lee, Fremont, CA (US)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 362 days.

(21) Appl. No.: 15/964,287

(22) Filed: Apr. 27, 2018

(65) Prior Publication Data

US 2019/0334517 A1 Oct. 31, 2019

(51) Int. Cl.
| | | |
|---|---|---|
| H03K 17/08 | (2006.01) | |
| H03K 17/16 | (2006.01) | |
| H03F 3/45 | (2006.01) | |
| H03K 3/012 | (2006.01) | |
| H03F 1/52 | (2006.01) | |
| H03K 3/01 | (2006.01) | |
| H03K 19/003 | (2006.01) | |
| H02H 9/04 | (2006.01) | |

(52) U.S. Cl.
CPC ........... *H03K 17/161* (2013.01); *H03K 17/08* (2013.01); *H02H 9/046* (2013.01); *H03F 1/523* (2013.01); *H03F 3/45179* (2013.01); *H03F 2203/45631* (2013.01); *H03K 3/01* (2013.01); *H03K 3/012* (2013.01); *H03K 17/16* (2013.01); *H03K 19/003* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 8,963,615 B1* | 2/2015 | Abawi | ................ | H03K 17/161 327/415 |
| 2010/0066450 A1* | 3/2010 | Palmer | ................ | H04L 25/0278 330/261 |
| 2014/0300415 A1* | 10/2014 | Casiraghi | ............ | H03F 3/45928 330/260 |
| 2017/0359532 A1* | 12/2017 | Yuan | ...................... | H04N 5/378 |

* cited by examiner

*Primary Examiner* — Danny Nguyen
(74) *Attorney, Agent, or Firm* — McClure, Qualey & Rodack, LLP (57) ABSTRACT

An output driving system includes an output driver, a first ESD (Electrostatic Discharge) protection circuit, a second ESD protection circuit, a first differential amplifier, a second differential amplifier, a first capacitor, and a second capacitor. The output driver has a first output node for outputting a first output voltage, and a second output node for outputting a second output voltage. The first differential amplifier generates a first amplified voltage according to the first output voltage and the second output voltage. The first capacitor has a first terminal for receiving the first amplified voltage, and a second terminal coupled to the first output node. The second differential amplifier generates a second amplified voltage according to the first output voltage and the second output voltage. The second capacitor has a first terminal for receiving the second amplified voltage, and a second terminal coupled to the second output node.

13 Claims, 6 Drawing Sheets

OUTPUT DRIVING SYSTEM WITH CAPACITANCE COMPENSATION

BACKGROUND OF THE INVENTION

Field of the Invention

The disclosure generally relates to an output driving system, and more specifically, to an output driving system with capacitance compensation.

Description of the Related Art

In modern high-speed communication, jitter performance depends on short rising/falling time of clock signals. However, wiring and gate layout contributes a large parasitic capacitance, and it may increase the rising/falling time and limit the transmission speed of the circuitry. Some prior documents use a T-coil circuit including two inductors to cancel the parasitic capacitance, but these designs occupy too large chip area and cover only a narrow frequency range. Accordingly, there is a need to propose a novel solution for solving the problems of the prior art.

BRIEF SUMMARY OF THE INVENTION

In a preferred embodiment, the invention is directed to an output driving system with capacitance compensation. The output driving system includes an output driver, a first ESD (Electrostatic Discharge) protection circuit, a second ESD protection circuit, a first differential amplifier, a second differential amplifier, a first capacitor, and a second capacitor. The output driver has a first output node for outputting a first output voltage, and a second output node for outputting a second output voltage. The first ESD protection circuit is coupled to the first output node. The second ESD protection circuit is coupled to the second output node. The first differential amplifier generates a first amplified voltage according to the first output voltage and the second output voltage. The first capacitor has a first terminal for receiving the first amplified voltage, and a second terminal coupled to the first output node. The second differential amplifier generates a second amplified voltage according to the first output voltage and the second output voltage. The second capacitor has a first terminal for receiving the second amplified voltage, and a second terminal coupled to the second output node.

In some embodiments, the capacitance of the first capacitor is substantially equal to the total parasitic capacitance at the first output node, and the capacitance of the second capacitor is substantially equal to the total parasitic capacitance at the second output node.

In some embodiments, a gain factor of each of the first differential amplifier and the second differential amplifier is substantially equal to 2.

In some embodiments, each of the first differential amplifier and the second differential amplifier includes a first P-type transistor, a second P-type transistor, a third P-type transistor, a first N-type transistor, a second N-type transistor, a third N-type transistor, and an inductor. The first P-type transistor has a control terminal coupled to a first node, a first terminal coupled to a supply voltage, and a second terminal coupled to the first node. The second P-type transistor has a control terminal coupled to the first node, a first terminal coupled to the supply voltage, and a second terminal coupled to a first amplifier output node. The first N-type transistor has a control terminal coupled to a first amplifier input node, a first terminal coupled to a ground voltage, and a second terminal coupled to the first node. The second N-type transistor has a control terminal coupled to a second amplifier input node, a first terminal coupled to the ground voltage, and a second terminal coupled to the first amplifier output node. The inductor has a first terminal coupled to the first amplifier output node, and a second terminal coupled to a second node. The third P-type transistor has a control terminal coupled to the second node, a first terminal coupled to the supply voltage, and a second terminal coupled to the second node. The third N-type transistor has a control terminal coupled to the second node, a first terminal coupled to the ground voltage, and a second terminal coupled to the second node.

In some embodiments, the first amplifier input node of the first differential amplifier is arranged for receiving the first output voltage, the second amplifier input node of the first differential amplifier is arranged for receiving the second output voltage, and the first amplifier output node of the first differential amplifier is arranged for outputting the first amplified voltage. The first amplifier input node of the second differential amplifier is arranged for receiving the second output voltage, the second amplifier input node of the second differential amplifier is arranged for receiving the first output voltage, and the first amplifier output node of the second differential amplifier is arranged for outputting the second amplified voltage.

In some embodiments, the transistor size of each of the first P-type transistor and the second P-type transistor is substantially twice that of the third P-type transistor. The transistor size of each of the first N-type transistor and the second N-type transistor is substantially twice that of the third N-type transistor.

In some embodiments, the output driving system further includes a third differential amplifier, a fourth differential amplifier, a third capacitor, and a fourth capacitor. The third differential amplifier generates a third amplified voltage according to the first output voltage and the second output voltage. The third capacitor has a first terminal for receiving the third amplified voltage, and a second terminal coupled to the first output node. The fourth differential amplifier generates a fourth amplified voltage according to the first output voltage and the second output voltage. The fourth capacitor has a first terminal for receiving the fourth amplified voltage, and a second terminal coupled to the second output node.

In some embodiments, a capacitance of each of the first capacitor and the third capacitor is substantially equal to a half of a total parasitic capacitance at the first output node. A capacitance of each of the second capacitor and the fourth capacitor is substantially equal to a half of a total parasitic capacitance at the second output node.

In some embodiments, a gain factor of each of the first differential amplifier, the second differential amplifier, the third differential amplifier, and the fourth differential amplifier is substantially equal to 2.

In some embodiments, each of the third differential amplifier and the fourth differential amplifier includes a fourth P-type transistor, a fifth P-type transistor, a sixth P-type transistor, a seventh P-type transistor, a fourth N-type transistor, a fifth N-type transistor, a sixth N-type transistor, a seventh N-type transistor, and a fifth capacitor. The fourth P-type transistor has a control terminal coupled to a third node, a first terminal coupled to a supply voltage, and a second terminal coupled to the third node. The fifth P-type transistor has a control terminal coupled to the third node, a first terminal coupled to the supply voltage, and a second terminal coupled to a fourth node. The sixth P-type transistor has a control terminal for receiving a first bias voltage, a first terminal coupled to the fourth node, and a second terminal coupled to a second amplifier output node. The fourth N-type transistor has a control terminal coupled to a third amplifier input node, a first terminal coupled to a ground voltage, and a second terminal coupled to the third node. The fifth N-type transistor has a control terminal coupled to a fourth amplifier input node, a first terminal coupled to the ground voltage, and a second terminal coupled to a fifth node. The sixth N-type transistor has a control terminal for receiving a second bias voltage, a first terminal coupled to the fifth node, and a second terminal coupled to the second amplifier output node. The seventh P-type transistor has a control terminal coupled to the second amplifier output node, a first terminal coupled to the supply voltage, and a second terminal coupled to the second amplifier output node. The seventh N-type transistor has a control terminal coupled to the second amplifier output node, a first terminal coupled to the ground voltage, and a second terminal coupled to the second amplifier output node. The fifth capacitor has a first terminal coupled to the second amplifier output node, and a second terminal coupled to the ground voltage.

In some embodiments, the sum of the first bias voltage and the second bias voltage is substantially equal to the supply voltage, and the second bias voltage is higher than the first bias voltage.

In some embodiments, the third amplifier input node of the third differential amplifier is arranged for receiving the first output voltage, the fourth amplifier input node of the third differential amplifier is arranged for receiving the second output voltage, and the second amplifier output node of the third differential amplifier is arranged for outputting the third amplified voltage. The third amplifier input node of the fourth differential amplifier is arranged for receiving the second output voltage, the fourth amplifier input node of the fourth differential amplifier is arranged for receiving the first output voltage, and the second amplifier output node of the fourth differential amplifier is arranged for outputting the fourth amplified voltage.

In some embodiments, the transistor size of each of the fourth P-type transistor, the fifth P-type transistor, and the sixth P-type transistor is substantially twice that of the seventh P-type transistor. The transistor size of each of the fourth N-type transistor, the fifth N-type transistor, and the sixth N-type transistor is substantially twice that of the seventh N-type transistor.

In some embodiments, the output driver includes an eighth P-type transistor, a ninth P-type transistor, an eighth N-type transistor, a ninth N-type transistor, a first resistor, and a second resistor. The eighth P-type transistor has a control terminal coupled to a first input node, a first terminal coupled to a supply voltage, and a second terminal coupled to the first output node. The first input node is arranged for receiving a first input voltage. The ninth P-type transistor has a control terminal coupled to a second input node, a first terminal coupled to the supply voltage, and a second terminal coupled to the second output node. The second input node is arranged for receiving a second input voltage. The eighth N-type transistor has a control terminal coupled to the first input node, a first terminal coupled to a ground voltage, and a second terminal coupled to the first output node. The ninth N-type transistor has a control terminal coupled to the second input node, a first terminal coupled to the ground voltage, and a second terminal coupled to the second output node. The first resistor has a first terminal coupled to the first output node, and a second terminal coupled to an eighth node. The second resistor has a first terminal coupled to the second output node, and a second terminal coupled to the eighth node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
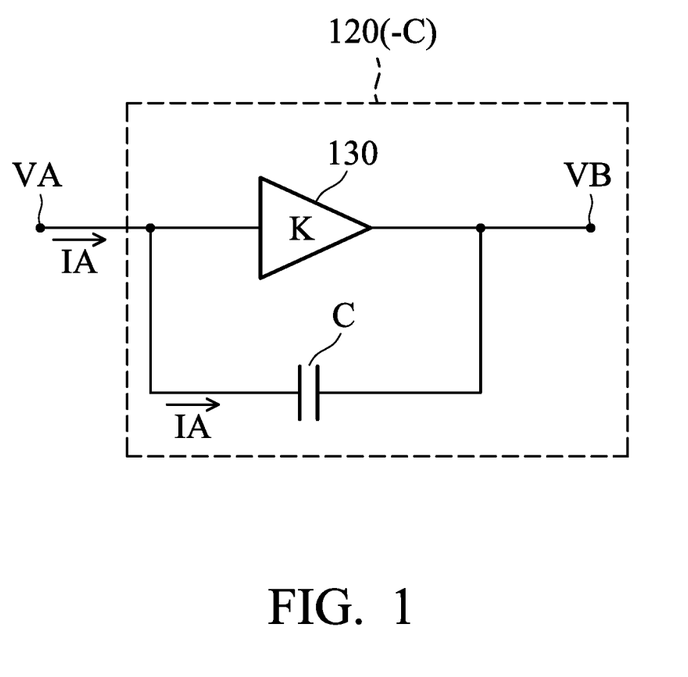
FIG. 1 is a diagram of a negative capacitance mechanism according to an embodiment of the invention.

FIG. 1 is a diagram of a negative capacitance mechanism 120 according to an embodiment of the invention. The embodiment of FIG. 1 describes a circuit solution to generate a negative capacitor −C. The negative capacitance mechanism 120 may be formed by a positive capacitor C and an amplifier 130. The amplifier 130 has a gain factor K, and it can amplify a first voltage VA by the gain factor K, so as to generate a second voltage VB. The positive capacitor C is coupled between the first voltage VA and the second voltage VB (i.e., between an input terminal and an output terminal of the amplifier 130). A current IA flows through the positive capacitor C. The effective impedance measured at the first voltage VA is calculated as the following equations (1) to (5).

$$IA = \frac{(VA - VB)}{\frac{1}{s \cdot C}} = (VA - VB) \cdot s \cdot C \quad (1)$$

-continued $$VB = K \cdot VA \quad (2)$$

$$IA = (1-K) \cdot VA \cdot s \cdot C \quad (3)$$

$$Z = \frac{VA}{IA} = \frac{1}{(1-K) \cdot s \cdot C} \quad (4)$$

$$CE = (1-K) \cdot C \quad (5)$$

where "VA" represents the voltage level of the first voltage VA, "VB" represents the voltage level of the second voltage VB, "C" represents the capacitance of the positive capacitor C, "K" represents the gain factor K of the amplifier 130, "s" represents the Laplace transform variable, "Z" represents the effective impedance measured at the first voltage VA, and "CE" represents the effective capacitance measured at the first voltage VA.

According to the equations (1) to (5), if the gain factor K is set to 2, the negative capacitor –C will be generated. The following embodiments will introduce the proposed design of the invention using the negative capacitance mechanism to improve the transmission and operation speed of circuitry. It should be understood that these embodiments are merely exemplary, rather than restricted limitations of the invention.

Figure 2:
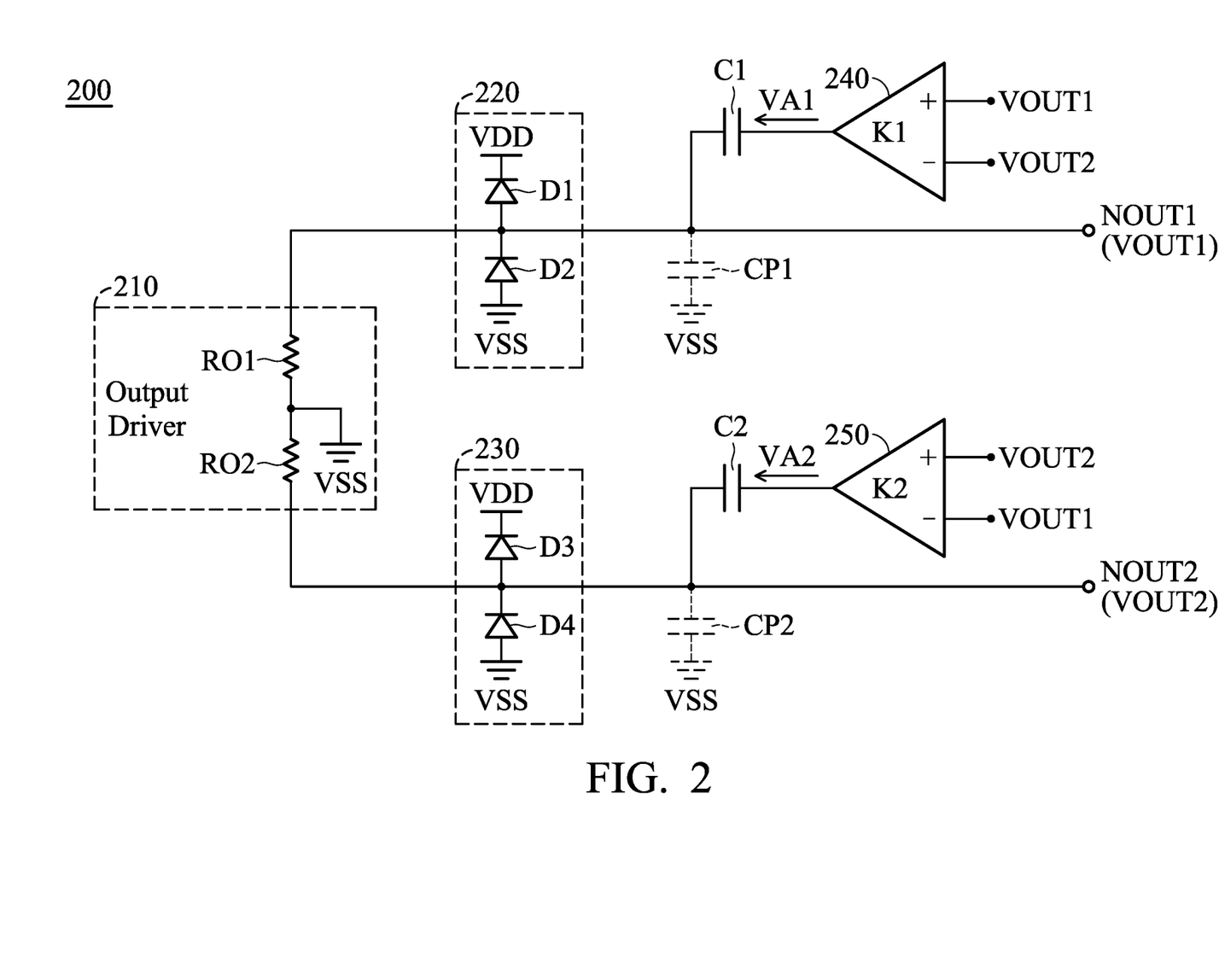
FIG. 2 is a diagram of an output driving system according to an embodiment of the invention.

FIG. 2 is a diagram of an output driving system 200 according to an embodiment of the invention. In the embodiment of FIG. 2, the output driving system 200 with capacitance compensation includes an output driver 210, a first ESD (Electrostatic Discharge) protection circuit 220, a second ESD protection circuit 230, a first differential amplifier 240, a second differential amplifier 250, a first capacitor C1, and a second capacitor C2. The output driver 210 has a first output node NOUT1 for outputting a first output voltage VOUT1, and a second output node NOUT2 for outputting a second output voltage VOUT2. For example, the first output voltage VOUT1 and the second output voltage VOUT2 may be outputted to a pair of transmission lines for transmission to a receiver. The total resistance of the output driver 210 at the first output node NOUT1 is modeled as a first output resistor RO1, which is coupled between the first output node NOUT1 and a ground voltage VSS (e.g., 0V). The total resistance of the output driver 210 at the second output node NOUT2 is modeled as a second output resistor RO2, which is coupled between the second output node NOUT2 and the ground voltage VSS. It should be understood that the first output resistor RO1 and the second output resistor RO2 are merely equivalent resistors, and they may or may not include physical elements of the output driver 210.

The first ESD protection circuit 220 is coupled to the first output node NOUT1, and the second ESD protection circuit 230 is coupled to the second output node NOUT2. In some embodiments, the first ESD protection circuit 220 includes a first diode D1 and a second diode D2, and the second ESD protection circuit 230 includes a third diode D3 and a fourth diode D4. The first diode D1 has an anode coupled to the first output node NOUT1, and a cathode coupled to a supply voltage VDD. The second diode D2 has an anode coupled to the ground voltage VSS, and a cathode coupled to the first output node NOUT1. The first diode D1 and the second diode D2 are configured to limit the swing range of the first output voltage VOUT1 at the first output node NOUT1. The third diode D3 has an anode coupled to the second output node NOUT2, and a cathode coupled to the supply voltage VDD. The fourth diode D4 has an anode coupled to the ground voltage VSS, and a cathode coupled to the second output node NOUT2. The third diode D3 and the fourth diode D4 are configured to limit the swing range of the second output voltage VOUT2 at the second output node NOUT2. However, the invention is not limited to the above. In alternative embodiments, the first ESD protection circuit 220 and the second ESD protection circuit 230 may be implemented with any different circuitry for limiting the first output voltage VOUT1 and the second output voltage VOUT2.

The first differential amplifier 240 generates a first amplified voltage VA1 according to the first output voltage VOUT1 and the second output voltage VOUT2. For example, the first differential amplifier 240 may have a gain factor K1, and it may amplify the first output voltage VOUT1 minus the second output voltage VOUT2 by the gain factor K1. The first capacitor C1 has a first terminal for receiving the first amplified voltage VA1, and a second terminal coupled to the first output node NOUT1. The second differential amplifier 250 generates a second amplified voltage VA2 according to the first output voltage VOUT1 and the second output voltage VOUT2. For example, the second differential amplifier 250 may have a gain factor K2, and it may amplify the second output voltage VOUT2 minus the first output voltage VOUT1 by the gain factor K2. The second capacitor C2 has a first terminal for receiving the second amplified voltage VA2, and a second terminal coupled to the second output node NOUT2. The operation principles of the first differential amplifier 240 and the second differential amplifier 250 may be calculated using the following equations (6) and (7).

$$VA1 = K1 \cdot (VOUT1 - VOUT2) \quad (6)$$

$$VA2 = K2 \cdot (VOUT2 - VOUT1) \quad (7)$$

where "VA1" represents the voltage level of the first amplified voltage VA1, "VA2" represents the voltage level of the second amplified voltage VA2, "VOUT1" represents the voltage level of the first output voltage VOUT1, "VOUT2" represents the voltage level of the second output voltage VOUT2, "K1" represents the gain factor K1 of the first differential amplifier 240, and "K2" represents the gain factor K2 of the second differential amplifier 250.

Both the output driver 210 and the first ESD protection circuit 220 contribute to the total parasitic capacitance at the first output node NOUT1. The total parasitic capacitance at the first output node NOUT1 is modeled as a first parasitic capacitor CP1, which is coupled between the first output node NOUT1 and the ground voltage VSS. In the embodiment of FIG. 2, the capacitance of the first capacitor C1 is substantially equal to the capacitance of the first parasitic capacitor CP1, and the gain factor K1 of the first differential amplifier 240 is substantially equal to 2, such that the first parasitic capacitor CP1 is cancelled by the first capacitor C1 using the aforementioned negative capacitance mechanism. Similarly, both the output driver 210 and the second ESD protection circuit 230 contribute to the total parasitic capacitance at the second output node NOUT2. The total parasitic capacitance at the second output node NOUT2 is modeled as a second parasitic capacitor CP2, which is coupled between the second output node NOUT2 and the ground voltage VSS. In the embodiment of FIG. 2, the capacitance of the second capacitor C2 is substantially equal to the capacitance of the second parasitic capacitor CP2, and the gain factor K2 of the second differential amplifier 250 is substantially equal to 2, such that the second parasitic capacitor CP2 is cancelled by the second capacitor C2 using the aforementioned negative capacitance mechanism. It should be noted that the first parasitic capacitor CP1 and the second parasitic capacitor CP2 increases the rising/falling time of the output driver 210 and reduces the transmission speed of the output driving system 200. Since the proposed design compensates for the non-ideal characteristics of the first parasitic capacitor CP1 and the second parasitic capacitor CP2, the transmission and operation speed of the output driving system 200 can be significantly improved. Furthermore, the output driving system 200 can provide a sufficiently large bandwidth because of the wideband characteristic of the aforementioned negative capacitance mechanism. According to simulations, the total operation bandwidth of the output driving system 200 can be improved to 14.9 GHz (with the criterion of return loss above 16 dB).

Figure 3:
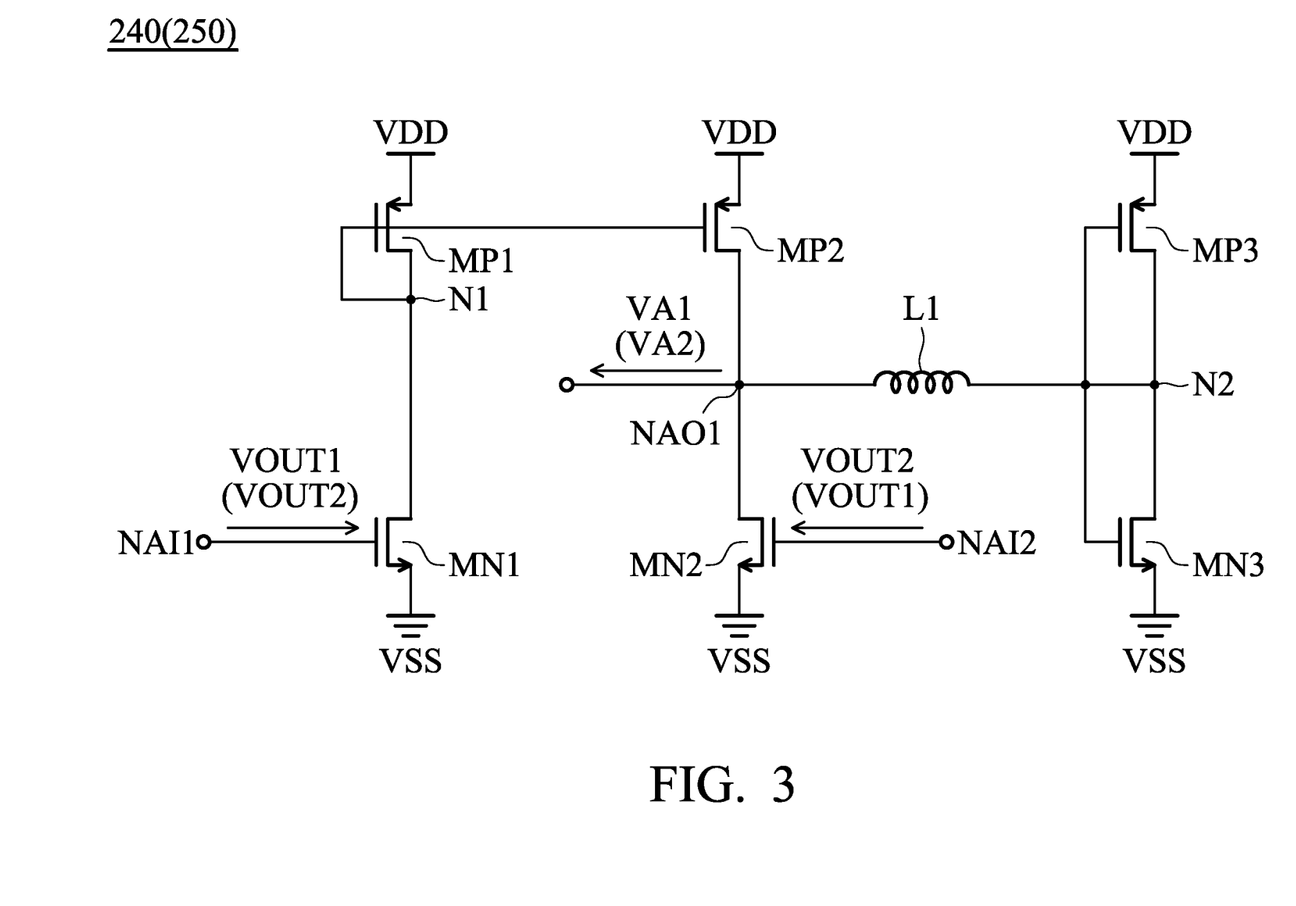
FIG. 3 is a diagram of a first differential amplifier or a second differential amplifier according to an embodiment of the invention.

FIG. 3 is a diagram of each of the first differential amplifier 240 and the second differential amplifier 250 according to an embodiment of the invention. In the embodiment of FIG. 3, each of the first differential amplifier 240 and the second differential amplifier 250 has a first amplifier input node NAI1, a second amplifier input node NAI2, and a first amplifier output node NAO1, and includes a first P-type transistor MP1, a second P-type transistor MP2, a third P-type transistor MP3, a first N-type transistor MN1, a second N-type transistor MN2, a third N-type transistor MN3, and an inductor L1. The first P-type transistor MP1, the second P-type transistor MP2, and the third P-type transistor MP3 may be PMOS transistors (P-type Metal Oxide Semiconductor Field Effect Transistors). The first N-type transistor MN1, the second N-type transistor MN2, and the third N-type transistor MN3 may be NMOS transistors (N-type Metal Oxide Semiconductor Field Effect Transistors). The inductor L1 may be a fixed inductor or a variable inductor.

The first P-type transistor MP1 has a control terminal coupled to a first node N1, a first terminal coupled to the supply voltage VDD, and a second terminal coupled to the first node N1. The second P-type transistor MP2 has a control terminal coupled to the first node N1, a first terminal coupled to the supply voltage VDD, and a second terminal coupled to the first amplifier output node NAO1. A current mirror is formed by the first P-type transistor MP1 and the second P-type transistor MP2. The first N-type transistor MN1 has a control terminal coupled to the first amplifier input node NAI1, a first terminal coupled to the ground voltage VSS, and a second terminal coupled to the first node N1. The second N-type transistor MN2 has a control terminal coupled to the second amplifier input node NAI2, a first terminal coupled to the ground voltage VSS, and a second terminal coupled to the first amplifier output node NAO1. A differential input circuit is formed by the first N-type transistor MN1 and the second N-type transistor MN2. The inductor L1 has a first terminal coupled to the first amplifier output node NAO1, and a second terminal coupled to a second node N2. The third P-type transistor MP3 has a control terminal coupled to the second node N2, a first terminal coupled to the supply voltage VDD, and a second terminal coupled to the second node N2. The third N-type transistor MN3 has a control terminal coupled to the second node N2, a first terminal coupled to the ground voltage VSS, and a second terminal coupled to the second node N2. A loading circuit is formed by the inductor L1, the third P-type transistor MP3, and the third N-type transistor MN3.

When FIG. 3 describes the circuit structure of the first differential amplifier 240, the first amplifier input node NAI1 of the first differential amplifier 240 is arranged for receiving the first output voltage VOUT1, the second amplifier input node NAI2 of the first differential amplifier 240 is arranged for receiving the second output voltage VOUT2, and the first amplifier output node NAO1 of the first differential amplifier 240 is arranged for outputting the first amplified voltage VA1. Conversely, when FIG. 3 describes the circuit structure of the second differential amplifier 250, the first amplifier input node NAI1 of the second differential amplifier 250 is arranged for receiving the second output voltage VOUT2, the second amplifier input node NAI2 of the second differential amplifier 250 is arranged for receiving the first output voltage VOUT1, and the first amplifier output node NAO1 of the second differential amplifier 250 is arranged for outputting the second amplified voltage VA2.

The first differential amplifier 240 and the second differential amplifier 250 are used to cover a relatively high frequency band because the impedance of the inductor L1 is relatively large and the corresponding amplifier gain is sufficiently high in the aforementioned high frequency band. In some embodiments, the transistor size (i.e., aspect ratio) of each of the first P-type transistor MP1 and the second P-type transistor MP2 is substantially twice the transistor size of the third P-type transistor MP3, and the transistor size of each of the first N-type transistor MN1 and the second N-type transistor MN2 is substantially twice the transistor size of the third N-type transistor MN3. Such a design can make the gain factor K1 of the first differential amplifier 240 and the gain factor K2 of the second differential amplifier 250 both substantially equal to 2, thereby optimizing the aforementioned negative capacitance mechanism. Specifically, the relationship between the above transistor sizes may be calculated using the following equations (8) and (9).

$$\left(\frac{W}{L}\right)_{MP1} = \left(\frac{W}{L}\right)_{MP2} = 2 \cdot \left(\frac{W}{L}\right)_{MP3} \tag{8}$$

$$\left(\frac{W}{L}\right)_{MN1} = \left(\frac{W}{L}\right)_{MN2} = 2 \cdot \left(\frac{W}{L}\right)_{MN3} \tag{9}$$

where "$\left(\frac{W}{L}\right)_{MP1}$"

represents the aspect ratio of the first P-type transistor MP1,

"$\left(\frac{W}{L}\right)_{MP2}$"

represents the aspect ratio of the second P-type transistor MP2,

"$\left(\frac{W}{L}\right)_{MP3}$"

represents the aspect ratio of the third P-type transistor MP3,

"$\left(\frac{W}{L}\right)_{MN1}$"

represents the aspect ratio of the first N-type transistor MN1,

"$\left(\frac{W}{L}\right)_{MN2}$"

represents the aspect ratio of the second N-type transistor MN2, and $$\left(\frac{W}{L}\right)_{MN3}$$

represents the aspect ratio of the third N-type transistor MN3.

In some embodiments, the capacitance of each of the first capacitor C1 and the second capacitor C2 is substantially equal to 0.8 pF, and the inductance of the inductor L1 is substantially equal to 0.15 nH, but they are not limited thereto.

Figure 4:
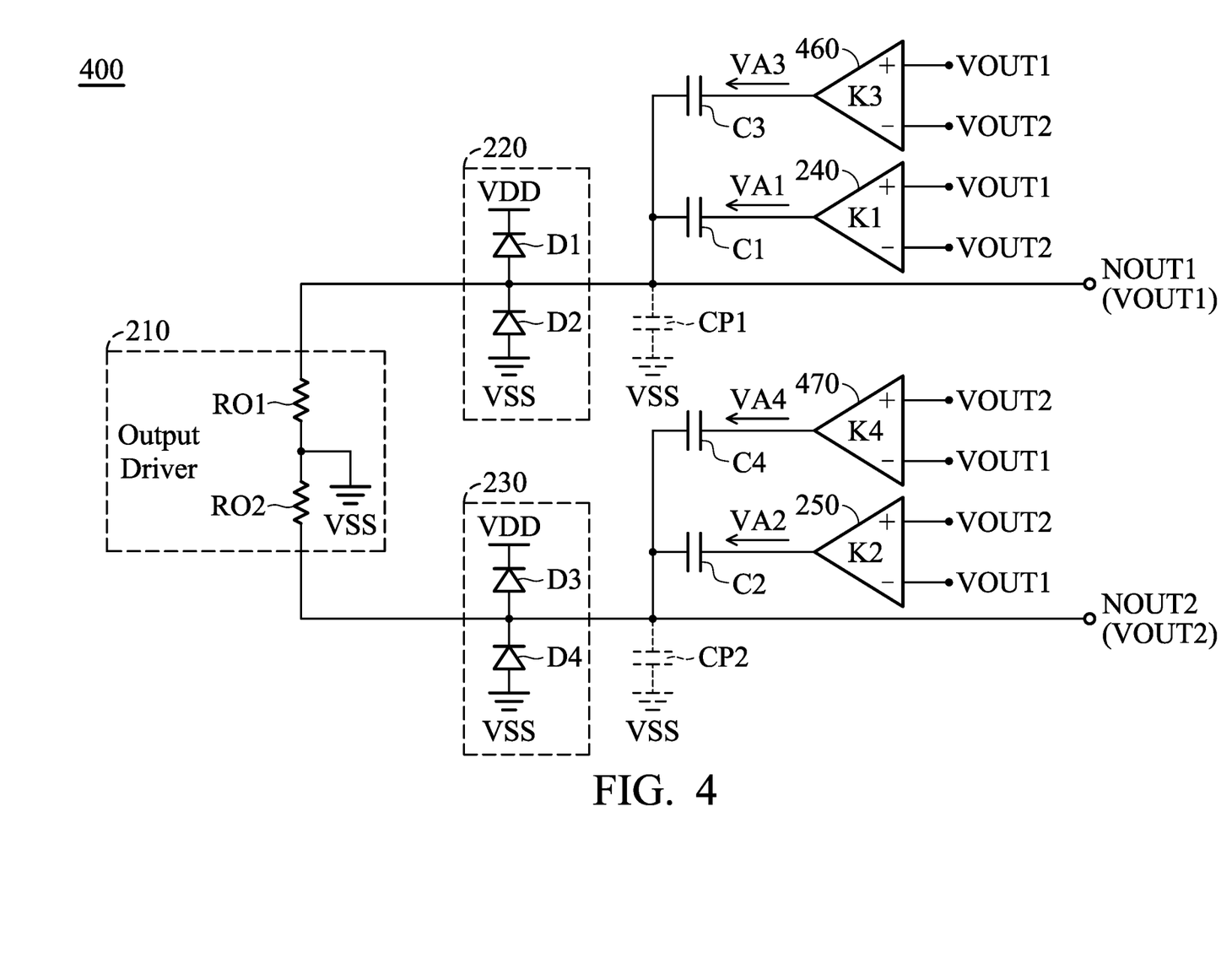
FIG. 4 is a diagram of an output driving system according to another embodiment of the invention.

FIG. 4 is a diagram of an output driving system 400 according to another embodiment of the invention. FIG. 4 is similar to FIG. 2. In the embodiment of FIG. 4, the output driving system 400 further includes a third differential amplifier 460, a fourth differential amplifier 470, a third capacitor C3, and a fourth capacitor C4. The structures and functions of the output driver 210, the first ESD protection circuit 220, the second ESD protection circuit 230, the first differential amplifier 240, and the second differential amplifier 250 have been described in the embodiment of FIG. 2. The third differential amplifier 460 generates a third amplified voltage VA3 according to the first output voltage VOUT1 and the second output voltage VOUT2. For example, the third differential amplifier 460 may have a gain factor K3, and it may amplify the first output voltage VOUT1 minus the second output voltage VOUT2 by the gain factor K3. The third capacitor C3 has a first terminal for receiving the third amplified voltage VA3, and a second terminal coupled to the first output node NOUT1. The fourth differential amplifier 470 generates a fourth amplified voltage VA4 according to the first output voltage VOUT1 and the second output voltage VOUT2. For example, the fourth differential amplifier 470 may have a gain factor K4, and it may amplify the second output voltage VOUT2 minus the first output voltage VOUT1 by the gain factor K4. The fourth capacitor C4 has a first terminal for receiving the fourth amplified voltage VA4, and a second terminal coupled to the second output node NOUT2. The operation principles of the third differential amplifier 460 and the fourth differential amplifier 470 may be calculated using the following equations (10) and (11).

$$VA3=K3 \cdot (VOUT1-VOUT2) \quad (10)$$

$$VA4=K4 \cdot (VOUT2-VOUT1) \quad (11)$$

where "VA3" represents the voltage level of the third amplified voltage VA3, "VA4" represents the voltage level of the fourth amplified voltage VA4, "VOUT1" represents the voltage level of the first output voltage VOUT1, "VOUT2" represents the voltage level of the second output voltage VOUT2, "K3" represents the gain factor K3 of the third differential amplifier 460, and "K4" represents the gain factor K4 of the fourth differential amplifier 470.

As mentioned above, both the output driver 210 and the first ESD protection circuit 220 contribute to the total parasitic capacitance at the first output node NOUT1. The total parasitic capacitance at the first output node NOUT1 is modeled as the first parasitic capacitor CP1. In the embodiment of FIG. 4, the capacitance of the first capacitor C1 is substantially equal to a half of the capacitance of the first parasitic capacitor CP1, the capacitance of the third capacitor C3 is also substantially equal to the half of the capacitance of the first parasitic capacitor CP1, the gain factor K1 of the first differential amplifier 240 is substantially equal to 2, and the gain factor K3 of the third differential amplifier 460 is also substantially equal to 2, such that the first parasitic capacitor CP1 is cancelled by a combination of the first capacitor C1 and the third capacitor C3 using the aforementioned negative capacitance mechanism. Similarly, both the output driver 210 and the second ESD protection circuit 230 contribute to the total parasitic capacitance at the second output node NOUT2. The total parasitic capacitance at the second output node NOUT2 is modeled as the second parasitic capacitor CP2. In the embodiment of FIG. 4, the capacitance of the second capacitor C2 is substantially equal to a half of the capacitance of the second parasitic capacitor CP2, the capacitance of the fourth capacitor C4 is also substantially equal to the half of the capacitance of the second parasitic capacitor CP2, the gain factor K2 of the second differential amplifier 250 is substantially equal to 2, and the gain factor K4 of the fourth differential amplifier 470 is also substantially equal to 2, such that the second parasitic capacitor CP2 is cancelled by a combination of the second capacitor C2 and the fourth capacitor C4 using the aforementioned negative capacitance mechanism. Since the proposed design compensates for the non-ideal characteristics of the first parasitic capacitor CP1 and the second parasitic capacitor CP2, the transmission and operation speed of the output driving system 400 can be significantly improved. It should be noted that the output driving system 400 of FIG. 4 uses a dual-band solution, rather than a single-band solution as the output driving system 200 of FIG. 2. Specifically, the first differential amplifier 240, the first capacitor C1, the second differential amplifier 250, and the second capacitor C2 are configured to provide negative capacitance compensation in a relatively high frequency band. On the other hand, the third differential amplifier 460, the third capacitor C3, the fourth differential amplifier 470, and the fourth capacitor C4 are configured to provide negative capacitance compensation in a relatively low frequency band. Therefore, the total bandwidth of the output driving system 400 is further widened. According to simulations, the total operation bandwidth of the output driving system 400 can be improved to 18 GHz (with the criterion of return loss above 16 dB).

Figure 5:
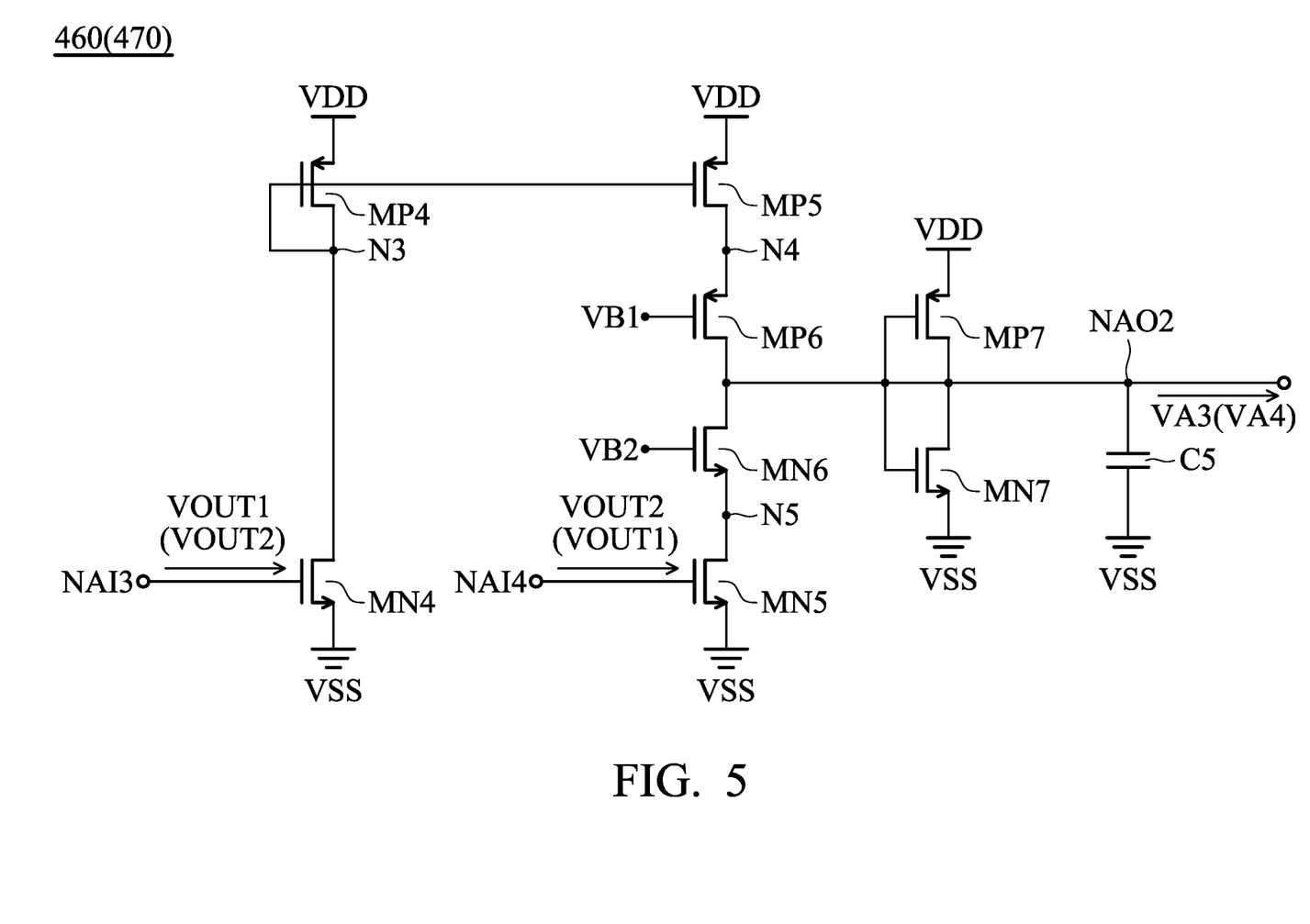
FIG. 5 is a diagram of a third differential amplifier or a fourth differential amplifier according to another embodiment of the invention.

FIG. 5 is a diagram of each of the third differential amplifier 460 and the fourth differential amplifier 470 according to another embodiment of the invention. In the embodiment of FIG. 5, each of the third differential amplifier 460 and the fourth differential amplifier 470 has a third amplifier input node NAI3, a fourth amplifier input node NAI4, and a second amplifier output node NAO2, and includes a fourth P-type transistor MP4, a fifth P-type transistor MP5, a sixth P-type transistor MP6, a seventh P-type transistor MP7, a fourth N-type transistor MN4, a fifth N-type transistor MN5, a sixth N-type transistor MN6, a seventh N-type transistor MN7, and a fifth capacitor C5. The fourth P-type transistor MP4, the fifth P-type transistor MP5, the sixth P-type transistor MP6, and the seventh P-type transistor MP7 may be PMOS transistors. The fourth N-type transistor MN4, the fifth N-type transistor MN5, the sixth N-type transistor MN6, and the seventh N-type transistor MN7 may be NMOS transistors. The fifth capacitor C5 may be a fixed capacitor or a variable capacitor.

The fourth P-type transistor MP4 has a control terminal coupled to a third node N3, a first terminal coupled to the supply voltage VDD, and a second terminal coupled to the third node N3. The fifth P-type transistor MP5 has a control terminal coupled to the third node N3, a first terminal coupled to the supply voltage VDD, and a second terminal coupled to a fourth node N4. A current mirror is formed by the fourth P-type transistor MP4 and the fifth P-type transistor MP5. The fourth N-type transistor MN4 has a control terminal coupled to the third amplifier input node NAI3, a first terminal coupled to the ground voltage VSS, and a second terminal coupled to the third node N3. The fifth N-type transistor MN5 has a control terminal coupled to the fourth amplifier input node NAI4, a first terminal coupled to the ground voltage VSS, and a second terminal coupled to a fifth node N5. A differential input circuit is formed by the fourth N-type transistor MN4 and the fifth N-type transistor MN5. The sixth P-type transistor MP6 has a control terminal for receiving a first bias voltage VB1, a first terminal coupled to the fourth node N4, and a second terminal coupled to the second amplifier output node NAO2. The sixth N-type transistor MN6 has a control terminal for receiving a second bias voltage VB2, a first terminal coupled to the fifth node N5, and a second terminal coupled to the second amplifier output node NAO2. A gain tuner (especially for the relatively low frequency band) is formed by the sixth P-type transistor MP6 and the sixth N-type transistor MN6. The sum of the first bias voltage VB1 and the second bias voltage VB2 may be substantially equal to the supply voltage VDD. The second bias voltage VB2 may be higher than the first bias voltage VB1. For example, if the supply voltage VDD is equal to 1V, the first bias voltage VB1 may be equal to 0.2V, and the second bias voltage VB2 may be equal to 0.8V, so as to optimize the amplifier gain, but they are not limited thereto. The seventh P-type transistor MP7 has a control terminal coupled to the second amplifier output node NAO2, a first terminal coupled to the supply voltage VDD, and a second terminal coupled to the second amplifier output node NAO2. The seventh N-type transistor MN7 has a control terminal coupled to the second amplifier output node NAO2, a first terminal coupled to the ground voltage VSS, and a second terminal coupled to the second amplifier output node NAO2. The fifth capacitor C5 has a first terminal coupled to the second amplifier output node NAO2, and a second terminal coupled to the ground voltage VSS. A loading circuit is formed by the seventh P-type transistor MP7, the seventh N-type transistor MN7, and the fifth capacitor C5.

When FIG. 5 describes the circuit structure of the third differential amplifier 460, the third amplifier input node NAI3 of the third differential amplifier 460 is arranged for receiving the first output voltage VOUT1, the fourth amplifier input node NAI4 of the third differential amplifier 460 is arranged for receiving the second output voltage VOUT2, and the second amplifier output node NAO2 of the third differential amplifier 460 is arranged for outputting the third amplified voltage VA3. Conversely, when FIG. 5 describes the circuit structure of the fourth differential amplifier 470, the third amplifier input node NAI3 of the fourth differential amplifier 470 is arranged for receiving the second output voltage VOUT2, the fourth amplifier input node NAI4 of the fourth differential amplifier 470 is arranged for receiving the first output voltage VOUT1, and the second amplifier output node NAO2 of the fourth differential amplifier 470 is arranged for outputting the fourth amplified voltage VA4.

The third differential amplifier 460 and the fourth differential amplifier 470 are used to cover a relatively low frequency band because the impedance of the fifth capacitor C5 is relatively large and the corresponding amplifier gain is sufficiently high in the aforementioned low frequency band. In some embodiments, the transistor size of each of the fourth P-type transistor MP4, the fifth P-type transistor MP5, and the sixth P-type transistor MP6 is substantially twice the transistor size of the seventh P-type transistor MP7, and the transistor size of each of the fourth N-type transistor MN4, the fifth N-type transistor MN5, and the sixth N-type transistor MN6 is substantially twice the transistor size of the seventh N-type transistor MN7. Such a design can make the gain factor K3 of the third differential amplifier 460 and the gain factor K4 of the fourth differential amplifier 470 both substantially equal to 2, thereby optimizing the aforementioned negative capacitance mechanism. Specifically, the relationship between the above transistor sizes may be calculated using the following equations (12) and (13).

$$\left(\frac{W}{L}\right)_{MP4} = \left(\frac{W}{L}\right)_{MP5} = \left(\frac{W}{L}\right)_{MP6} = 2 \cdot \left(\frac{W}{L}\right)_{MP7} \tag{12}$$

$$\left(\frac{W}{L}\right)_{MN4} = \left(\frac{W}{L}\right)_{MN5} = \left(\frac{W}{L}\right)_{MN6} = 2 \cdot \left(\frac{W}{L}\right)_{MN7} \tag{13}$$

where "$\left(\frac{W}{L}\right)_{MP4}$"

represents the aspect ratio of the fourth P-type transistor MP4,

"$\left(\frac{W}{L}\right)_{MP5}$"

represents the aspect ratio of the fifth P-type transistor MP5,

"$\left(\frac{W}{L}\right)_{MP6}$"

represents the aspect ratio of the sixth P-type transistor MP6,

"$\left(\frac{W}{L}\right)_{MP7}$"

represents the aspect ratio of the seventh P-type transistor MP7,

"$\left(\frac{W}{L}\right)_{MN4}$"

represents the aspect ratio of the fourth N-type transistor MN4,

"$\left(\frac{W}{L}\right)_{MN5}$"

represents the aspect ratio of the fifth N-type transistor MN5,

"$\left(\frac{W}{L}\right)_{MN6}$"

represents the aspect ratio of the sixth N-type transistor MN6, and

"$\left(\frac{W}{L}\right)_{MN7}$"

represents the aspect ratio of the seventh N-type transistor MN7.

In some embodiments, the capacitance of each of the first capacitor C1, the second capacitor C2, the third capacitor C3, and the fourth capacitor C4 is substantially equal to 0.4 pF, and the capacitance of the fifth capacitor C5 is substantially equal to 0.1 pF, but they are not limited thereto.

Figure 6:
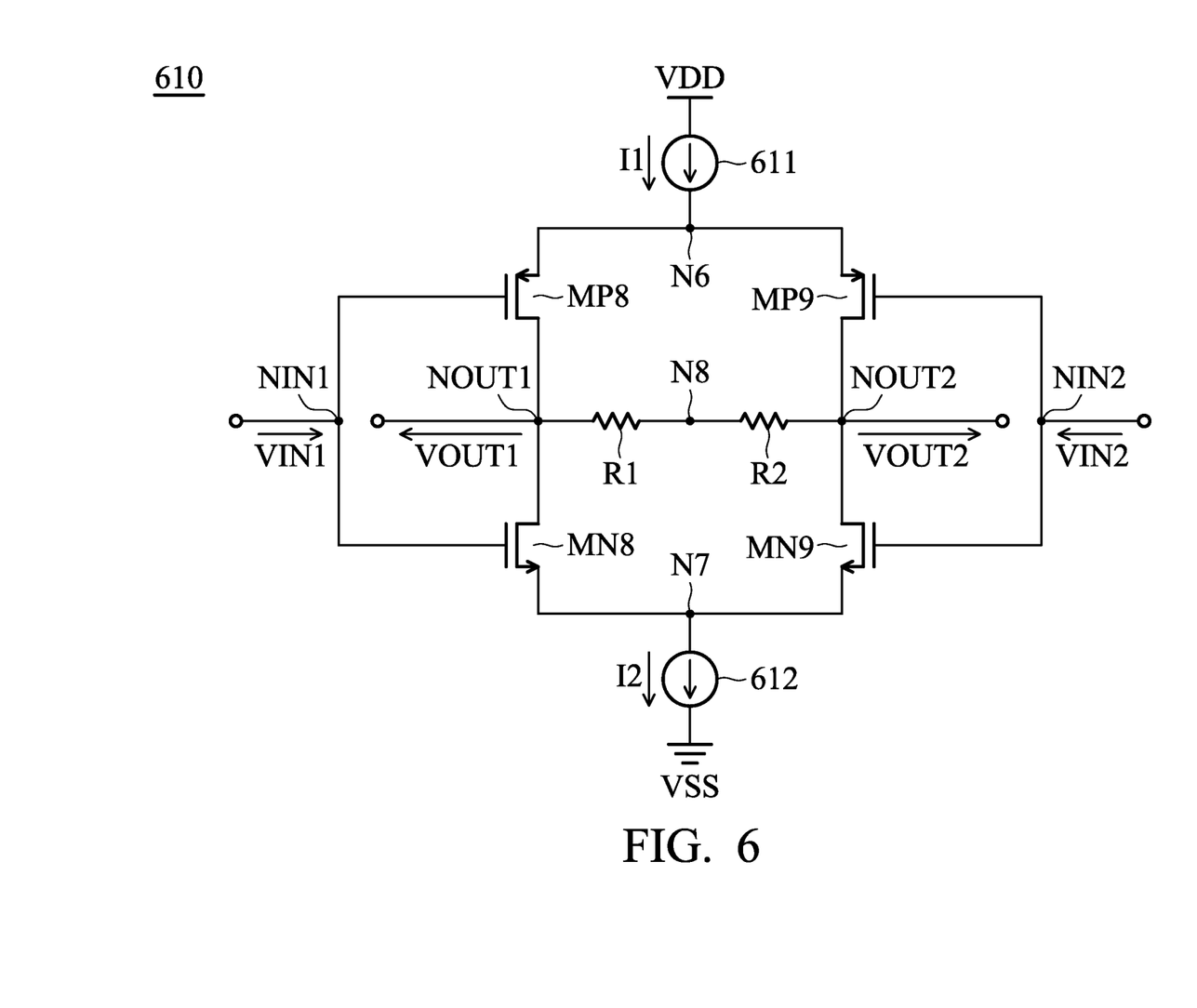
FIG. 6 is a diagram of an output driver according to another embodiment of the invention.

FIG. 6 is a diagram of an output driver 610 according to another embodiment of the invention. The output driver 610 of FIG. 6 may be applied to the output driving system 200 of FIG. 2 or the output driving system 400 of FIG. 4 as the output driver 210. In the embodiment of FIG. 6, the output driver 610 includes a current source 611, a current sink 612, an eighth P-type transistor MP8, a ninth P-type transistor MP9, an eighth N-type transistor MN8, a ninth N-type transistor MN9, a first resistor R1, and a second resistor R2. The eighth P-type transistor MP8 and the ninth P-type transistor MP9 may be PMOS transistors. The eighth N-type transistor MN8 and the ninth N-type transistor MN9 may be NMOS transistors.

The current source 611 supplies a first current I1 from the supply voltage VDD to a sixth node N6. The eighth P-type transistor MP8 has a control terminal coupled to a first input node NIN1 for receiving a first input voltage VIN1, a first terminal coupled to the sixth node N6, and a second terminal coupled to the first output node NOUT1 for outputting the first output voltage VOUT1. The ninth P-type transistor MP9 has a control terminal coupled to a second input node NIN2 for receiving a second input voltage VIN2, a first terminal coupled to the sixth node N6, and a second terminal coupled to the second output node NOUT2 for outputting the second output voltage VOUT2. The current sink 612 draws a second current I2 from a seventh node N7 to the ground voltage VSS. The eighth N-type transistor MN8 has a control terminal coupled to the first input node NIN1, a first terminal coupled to the seventh node N7, and a second terminal coupled to the first output node NOUT1. The ninth N-type transistor MN9 has a control terminal coupled to the second input node NIN2, a first terminal coupled to the seventh node N7, and a second terminal coupled to the second output node NOUT2. The first resistor R1 has a first terminal coupled to the first output node NOUT1, and a second terminal coupled to an eighth node N8. The second resistor R2 has a first terminal coupled to the second output node NOUT2, and a second terminal coupled to the eighth node N8. However, the invention is not limited to the above. In alternative embodiments, the output driver 610 may be implemented with any different circuitry for generating the first output voltage VOUT1 and the second output voltage VOUT2 according to the first input voltage VIN1 and the second input voltage VIN2. In another embodiment, the current source 611 and the current sink 612 may be omitted so that the sixth node N6 is coupled to the supply voltage VDD and the seventh node N7 is coupled to the ground voltage VSS. In one embodiment, the first resistor R1 and the second resistor R2 may be respectively included in the first output resistor RO1 and the second output resistor RO2 in FIG. 2 and FIG. 4, and the eighth node N8 may be floating or coupled to the ground voltage VSS.

The invention provides a novel output driving system with capacitance compensation. In conclusion, the proposed design has at least the following advantages over the prior art: (1) compensating for non-ideal parasitic capacitance with a negative capacitance mechanism, (2) covering a wide frequency range, (3) providing a high transmission and operation speed of circuitry, (4) being more insensitive to the variations of PVT (Process, Voltage, and Temperature) variations, and (5) removing the T-coil circuit with two inductors for the conventional design.

Note that the above voltages, currents, resistances, inductances, capacitances and other element parameters are not limitations of the invention. A designer can adjust these parameters according to different requirements. The output driving system of the invention is not limited to the configurations of FIGS. 1-6. The invention may merely include any one or more features of any one or more embodiments of FIGS. 1-6. In other words, not all of the features displayed in the figures should be implemented in the output driving system of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. An output driving system with capacitance compensation, comprising:
   an output driver, wherein the output driver has a first output node for outputting a first output voltage, and a second output node for outputting a second output voltage;
   a first ESD (Electrostatic Discharge) protection circuit, coupled to the first output node;
   a second ESD protection circuit, coupled to the second output node;
   a first differential amplifier, generating a first amplified voltage according to the first output voltage and the second output voltage;
   a first capacitor, wherein the first capacitor has a first terminal for receiving the first amplified voltage, and a second terminal coupled to the first output node;
   a second differential amplifier, generating a second amplified voltage according to the first output voltage and the second output voltage; and
   a second capacitor, wherein the second capacitor has a first terminal for receiving the second amplified voltage, and a second terminal coupled to the second output node;
   wherein a gain factor of each of the first differential amplifier and the second differential amplifier is substantially equal to 2.

2. The output driving system as claimed in claim 1, wherein a capacitance of the first capacitor is substantially equal to a total parasitic capacitance at the first output node, and wherein a capacitance of the second capacitor is substantially equal to a total parasitic capacitance at the second output node.

3. The output driving system as claimed in claim 1, wherein each of the first differential amplifier and the second differential amplifier comprises:
    a first P-type transistor, wherein the first P-type transistor has a control terminal coupled to a first node, a first terminal coupled to a supply voltage, and a second terminal coupled to the first node;
    a second P-type transistor, wherein the second P-type transistor has a control terminal coupled to the first node, a first terminal coupled to the supply voltage, and a second terminal coupled to a first amplifier output node;
    a first N-type transistor, wherein the first N-type transistor has a control terminal coupled to a first amplifier input node, a first terminal coupled to a ground voltage, and a second terminal coupled to the first node;
    a second N-type transistor, wherein the second N-type transistor has a control terminal coupled to a second amplifier input node, a first terminal coupled to the ground voltage, and a second terminal coupled to the first amplifier output node;
    an inductor, wherein the inductor has a first terminal coupled to the first amplifier output node, and a second terminal coupled to a second node;
    a third P-type transistor, wherein the third P-type transistor has a control terminal coupled to the second node, a first terminal coupled to the supply voltage, and a second terminal coupled to the second node; and
    a third N-type transistor, wherein the third N-type transistor has a control terminal coupled to the second node, a first terminal coupled to the ground voltage, and a second terminal coupled to the second node.

4. The output driving system as claimed in claim 3, wherein the first amplifier input node of the first differential amplifier is arranged for receiving the first output voltage, the second amplifier input node of the first differential amplifier is arranged for receiving the second output voltage, and the first amplifier output node of the first differential amplifier is arranged for outputting the first amplified voltage, and wherein the first amplifier input node of the second differential amplifier is arranged for receiving the second output voltage, the second amplifier input node of the second differential amplifier is arranged for receiving the first output voltage, and the first amplifier output node of the second differential amplifier is arranged for outputting the second amplified voltage.

5. The output driving system as claimed in claim 3, wherein a transistor size of each of the first P-type transistor and the second P-type transistor is substantially twice that of the third P-type transistor, and wherein a transistor size of each of the first N-type transistor and the second N-type transistor is substantially twice that of the third N-type transistor.

6. The output driving system as claimed in claim 1, further comprising:
    a third differential amplifier, generating a third amplified voltage according to the first output voltage and the second output voltage;
    a third capacitor, wherein the third capacitor has a first terminal for receiving the third amplified voltage, and a second terminal coupled to the first output node;
    a fourth differential amplifier, generating a fourth amplified voltage according to the first output voltage and the second output voltage; and
    a fourth capacitor, wherein the fourth capacitor has a first terminal for receiving the fourth amplified voltage, and a second terminal coupled to the second output node.

7. The output driving system as claimed in claim 6, wherein a capacitance of each of the first capacitor and the third capacitor is substantially equal to a half of a total parasitic capacitance at the first output node, and wherein a capacitance of each of the second capacitor and the fourth capacitor is substantially equal to a half of a total parasitic capacitance at the second output node.

8. The output driving system as claimed in claim 6, wherein a gain factor of each of the first differential amplifier, the second differential amplifier, the third differential amplifier, and the fourth differential amplifier is substantially equal to 2.

9. The output driving system as claimed in claim 6, wherein each of the third differential amplifier and the fourth differential amplifier comprises:
    a fourth P-type transistor, wherein the fourth P-type transistor has a control terminal coupled to a third node, a first terminal coupled to a supply voltage, and a second terminal coupled to the third node;
    a fifth P-type transistor, wherein the fifth P-type transistor has a control terminal coupled to the third node, a first terminal coupled to the supply voltage, and a second terminal coupled to a fourth node;
    a sixth P-type transistor, wherein the sixth P-type transistor has a control terminal for receiving a first bias voltage, a first terminal coupled to the fourth node, and a second terminal coupled to a second amplifier output node;
    a fourth N-type transistor, wherein the fourth N-type transistor has a control terminal coupled to a third amplifier input node, a first terminal coupled to a ground voltage, and a second terminal coupled to the third node;
    a fifth N-type transistor, wherein the fifth N-type transistor has a control terminal coupled to a fourth amplifier input node, a first terminal coupled to the ground voltage, and a second terminal coupled to a fifth node;
    a sixth N-type transistor, wherein the sixth N-type transistor has a control terminal for receiving a second bias voltage, a first terminal coupled to the fifth node, and a second terminal coupled to the second amplifier output node;
    a seventh P-type transistor, wherein the seventh P-type transistor has a control terminal coupled to the second amplifier output node, a first terminal coupled to the supply voltage, and a second terminal coupled to the second amplifier output node;
    a seventh N-type transistor, wherein the seventh N-type transistor has a control terminal coupled to the second amplifier output node, a first terminal coupled to the ground voltage, and a second terminal coupled to the second amplifier output node; and
    a fifth capacitor, wherein the fifth capacitor has a first terminal coupled to the second amplifier output node, and a second terminal coupled to the ground voltage.

10. The output driving system as claimed in claim 9, wherein the sum of the first bias voltage and the second bias voltage is substantially equal to the supply voltage, and the second bias voltage is higher than the first bias voltage.

11. The output driving system as claimed in claim 9, wherein the third amplifier input node of the third differential amplifier is arranged for receiving the first output voltage, the fourth amplifier input node of the third differ-ential amplifier is arranged for receiving the second output voltage, and the second amplifier output node of the third differential amplifier is arranged for outputting the third amplified voltage, and wherein the third amplifier input node of the fourth differential amplifier is arranged for receiving the second output voltage, the fourth amplifier input node of the fourth differential amplifier is arranged for receiving the first output voltage, and the second amplifier output node of the fourth differential amplifier is arranged for outputting the fourth amplified voltage.

12. The output driving system as claimed in claim 9, wherein a transistor size of each of the fourth P-type transistor, the fifth P-type transistor, and the sixth P-type transistor is substantially twice that of the seventh P-type transistor, and wherein a transistor size of each of the fourth N-type transistor, the fifth N-type transistor, and the sixth N-type transistor is substantially twice that of the seventh N-type transistor.

13. The output driving system as claimed in claim 1, wherein the output driver comprises:

an eighth P-type transistor, wherein the eighth P-type transistor has a control terminal coupled to a first input node, a first terminal coupled to a supply voltage, and a second terminal coupled to the first output node, and wherein the first input node is arranged for receiving a first input voltage;

a ninth P-type transistor, wherein the ninth P-type transistor has a control terminal coupled to a second input node, a first terminal coupled to the supply voltage, and a second terminal coupled to the second output node, and wherein the second input node is arranged for receiving a second input voltage;

an eighth N-type transistor, wherein the eighth N-type transistor has a control terminal coupled to the first input node, a first terminal coupled to a ground voltage, and a second terminal coupled to the first output node;

a ninth N-type transistor, wherein the ninth N-type transistor has a control terminal coupled to the second input node, a first terminal coupled to the ground voltage, and a second terminal coupled to the second output node;

a first resistor, wherein the first resistor has a first terminal coupled to the first output node, and a second terminal coupled to an eighth node; and a second resistor, wherein the second resistor has a first terminal coupled to the second output node, and a second terminal coupled to the eighth node.

* * * * *